(12) United States Patent
Bernier et al.

(10) Patent No.: US 6,550,667 B2
(45) Date of Patent: *Apr. 22, 2003

(54) FLUX COMPOSITION AND SOLDERING METHOD FOR HIGH DENSITY ARRAYS

(75) Inventors: William E. Bernier, Endwell, NY (US); Donald W. Henderson, Ithaca, NY (US); James Spalik, Kirkwood, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/726,697

(22) Filed: Nov. 29, 2000

(65) Prior Publication Data

US 2002/0063146 A1 May 30, 2002

Related U.S. Application Data

(63) Continuation-in-part of application No. 09/461,557, filed on Dec. 14, 1999, now Pat. No. 6,217,671.

(51) Int. Cl.⁷ .................... B23K 35/362; B23K 35/34
(52) U.S. Cl. .................... 228/207; 228/223; 148/23; 148/25
(58) Field of Search ................ 148/23, 25, 26; 228/207, 223, 33

(56) References Cited

U.S. PATENT DOCUMENTS

| | | | |
|---|---|---|---|
| 4,168,996 A | 9/1979 | Zado | |
| 4,194,931 A | * 3/1980 | Zado | 148/25 |
| 4,495,007 A | 1/1985 | Zado | |
| 4,523,712 A | 6/1985 | Zado | |
| 4,561,913 A | 12/1985 | Zado | |
| 4,838,478 A | 6/1989 | Froebel et al. | |
| 4,988,395 A | 1/1991 | Taguchi et al. | |
| 4,994,119 A | 2/1991 | Gutierrez et al. | |
| 5,004,508 A | 4/1991 | Mace et al. | |
| 5,004,509 A | 4/1991 | Bristol | |
| 5,041,169 A | 8/1991 | Oddy et al. | |
| 5,085,365 A | 2/1992 | Turner | |
| 5,127,968 A | 7/1992 | Gomi et al. | |
| 5,145,722 A | 9/1992 | Kaspaul | |
| 5,281,281 A | * 1/1994 | Stefanowski | 148/23 |
| 5,332,145 A | * 7/1994 | Bell et al. | 228/105 |
| 5,334,260 A | * 8/1994 | Stefanowski | 148/23 |
| 5,378,290 A | 1/1995 | Tazi et al. | |
| 5,417,771 A | 5/1995 | Arita et al. | |
| 5,443,660 A | 8/1995 | Gao et al. | |
| 5,507,882 A | * 4/1996 | Bristol et al. | 148/23 |
| 5,514,414 A | 5/1996 | Gao et al. | |
| 5,531,838 A | 7/1996 | Arldt et al. | |
| 5,571,340 A | 11/1996 | Schneider et al. | |
| 5,615,827 A | 4/1997 | Arldt et al. | |
| 6,217,671 B1 | * 4/2001 | Henderson et al. | 148/23 |

FOREIGN PATENT DOCUMENTS

| | | |
|---|---|---|
| JP | 6-182586 | 7/1994 |
| JP | 10-71487 | 3/1998 |
| RU | 270850 | 8/1970 |

\* cited by examiner

*Primary Examiner*—M. Alexandra Elve
*Assistant Examiner*—Len Tran
(74) *Attorney, Agent, or Firm*—RatnerPrestia

(57) ABSTRACT

A single phase flux composition suitable for use with high density arrays, that comprises dicarboxylic acid in an amount sufficient to react with the oxidized surface area in a high-density array, a first organic solvent, and a second organic solvent having a higher evaporation temperature than that of said first organic solvent. Preferred dicarboxylic acids are adipic, pimelic, suberic, azelaic and sebacic acids. Preferably, the composition comprises greater than 6% dicarboxylic acid, more preferably greater that 6% to about 15%, and even more preferably from about 8% to about 10% of the dicarboxylic acid. Preferred amounts of the first organic solvent are in the range of from about 25% to about 75% by weight and preferred amounts of the second organic solvent are from about 10% to about 35% by weight. Preferably, the ratio of the first organic solvent to the second organic solvent is about 3:1. A method for using the inventive composition to solder high density arrays which, for eutectic lead/tin solder, involves heating at extended dwell times and high temperature relative to typical compositions.

32 Claims, No Drawings

FLUX COMPOSITION AND SOLDERING METHOD FOR HIGH DENSITY ARRAYS

This application is a continuation-in-part of U.S. patent application Ser. No. 09/461,557, filed on Dec. 14, 1999 (issued as U.S. Pat. No. 6,217,671.

BACKGROUND OF THE INVENTION

1. Field of the Invention

The invention pertains to a flux composition and to a corresponding method for soldering, for example, a semiconductor chip or a chip carrier module to a printed circuit board. Specifically, the invention pertains to a flux composition and method for soldering high density C4 arrays.

2. Background

Fluxes play an important role in the procedures used to mount electronic components onto printed circuit cards and printed circuit boards (both of which are hereinafter generically referred to as printed circuit boards or PCBs). For example, one method for directly mounting a semiconductor integrated circuit device (hereinafter denominated a semiconductor chip or just a chip) onto a PCB is, for example, to form regions of solder, e.g., solder balls, on contact pads on the circuit-bearing surface of the chip. Such solder regions may also be formed on corresponding contact pads on the PCB. A flux is then applied to the solder regions on the chip and/or to the corresponding contact pads and/or corresponding solder regions on the PCB in order to remove oxide layers which may have formed on these solder regions or contact pads and to achieve increased wetting of the contact pads by the solder regions. Thereafter, with the circuit-bearing surface of the chip facing the PCB, the solder regions on the chip are brought into contact with the corresponding contact pads or solder regions on the PCB, and the resulting assembly is heated in order to melt, and thereby reflow, the solder regions on the chip and/or on the PCB. Upon cooling and re-solidification, the resulting solder connections between the chip and the PCB are typically encapsulated in an encapsulant, e.g., an epoxy resin encapsulant, to relieve any strains which may be engendered by a difference between the coefficient of thermal expansion (CTE) of the PCB and the CTE of the chip.

In a manner similar to that described above, one method for mounting a module, e.g., an organic module or a ceramic module, bearing semiconductor chips (hereinafter denominated a chip carrier module or just module) onto a PCB, involves forming, e.g., screening, regions of solder onto contact pads on the non-chip-bearing surface of the module. Such solder regions may also be formed on corresponding contact pads on the PCB. A flux is then applied to the solder regions on the module and/or to the corresponding contact pads and/or corresponding solder regions on the PCB. Thereafter, with the non-chip-bearing surface of the module facing the PCB, the solder regions on the module are brought into contact with the corresponding contact pads or solder regions on the PCB and the resulting assembly is heated in order to melt, and thereby reflow, the solder regions on the module and/or on the PCB. In general, the magnitude of the difference between the CTE of the module and the CTE of the PCB is relatively small, and therefore the resulting solder connections between the module and the PCB need not be encapsulated in an encapsulant.

If the module of interest has electrically conductive pins extending from the non-chip-bearing surface of the module, then the module is mounted onto a PCB by, for example, initially positioning the module over the top (i.e., the circuit-bearing) surface of the printed circuit board and inserting the electrically conductive pins of the module into corresponding, copper plated through holes (PTHs) extending through the thickness of the PCB. Then, the PCB and the module are placed on a conveyor, which passes the PCB and module over a fluxing wave or flux sprayer, which serves to impinge liquid flux onto the bottom surface of the PCB and into the PTHs. This flux is wicked up into the PTHs, and thus flux is applied to both the walls of the PTHs and to the pins extending into the PTHs. Thereafter, the conveyor passes the PCB and module over a solder wave, which serves to impinge liquid solder onto the bottom surface of the of the PCB and into the PTHs. This liquid solder is also wicked up into the PTHs, filling the PTHs and, upon cooling and solidification, serving to encapsulate the pins within the PTHs.

One of the most important aspects of the above-described chip-mounting and module-mounting procedures is the choice of flux. That is, as noted above, the flux serves to remove any oxide layers which may have formed on the solder regions, contact pads, pins or PTHs and to increase the wetting of, for example, contact pads by solder regions. In most instances, at the completion of the soldering process, use of the commonly available fluxes results in ionic residues remaining on the solder regions, contact pads, pins or PTHs. Such ionic residues are undesirable because they lead to corrosion of circuitry and to short circuits. Consequently, if formed, such ionic residues must be removed, e.g., cleaned with water, after the completion of the soldering process.

The solder connections formed between a chip and a PCB or between a pinless module and a PCB, as described above, have relatively small heights, e.g., 4 mils, and therefore the spacing between a chip or pinless module and its PCB is correspondingly small. This is significant because it implies that it would be very difficult, if not impossible, to clean away any ionic residues remaining on the solder regions and/or contact pads after the completion of the soldering process. In addition, in the case of a pinned module, while corresponding ionic residues are readily cleaned with water, one must then deal with the environmental hazards posed by the resulting contaminated water.

Significantly, those engaged in the development of fluxes and soldering processes for mounting chips and modules onto PCBs have sought, thus far with little success, fluxes which leave essentially no ionic residues on solder regions, contact pads, pins or PTHs at the completion of the corresponding soldering processes.

High density arrays present particular problems with regards to fluxes. Whereas typical low density arrays may have 32 contact points, high density arrays may have 300–2000 or even more contact points. Very large, high density C4 arrays present a problem not experienced in lower density arrays in that the total oxidized surface area of these C4 arrays deplete the usual active fluxing component before reflow is complete and consequently a significant number of non-wets results. Typically, increasing the active component concentration is not viable because of increased residues which increase the potential for electrical failure and decreased underfill adhesion.

Others solve this problem in several ways. The residues formed but not removed by cleaning may be made compatible with the underfill adhesive in order to promote adhesion by the addition of other components into the flux. However, this may result in material that may restrict flow of the underfill in the channels formed by the solder joints, which can result in void formation. Alternatively, the flux residues may require cleaning. Tools to perform adequate cleaning in spaces 0.0025" to 0.004" high are difficult to find and the process must be very thorough to remove residues which can cause subsequent delamination or lead to corrosion or dendritic growth from moisture exposure. Combined flux/underfill formulations have also been used, but significant challenges are still evident in promoting good solder joint formation, adequate adhesion and resistance to long term stress conditions. The proposed flux offers the simplest approach to provide optimum chip joint formation, underfill adhesion, and long term stress performance.

This invention succeeds where previous efforts have failed by providing a residue free flux composition suitable for high density arrays.

This invention provides advantages that were not previously appreciated by providing a flux effective for connecting high density arrays to printed circuit boards without leaving a residue.

SUMMARY OF THE INVENTION

In summary, the invention provides a flux composition which allows a higher concentration of a dicarboxylic active ingredient because of a unique property which allows it to volatilize more readily from the oxidized surface of the very dense arrays. The active fluxing component reacts with surface solder oxides at extended dwell times of 120 to 240 seconds above solder reflow temperature at peak temperatures in the range of 210° C. to 245° C. and preferably 220° C. to 245° C. for reflow of eutectic tin/lead solder, to enable solder joint information. The flux composition of the present invention may be used with other solder alloys at differing dwell time and peak temperature conditions.

The flux composition of the present invention is suitable for use with high density arrays and comprises a dicarboxylic acid in an amount sufficient to react with the oxidized surface area in a high density array, a first organic solvent, and a second organic solvent having a higher evaporation temperature than that of said first organic solvent. The composition optionally comprises up to about 2% by weight of water. The composition preferably comprises greater than 6% of the dicarboxylic acid, more preferably greater than 6% and than about 15% of the dicarboxylic acid, even more preferably comprises about 8% to about 10% of the dicarboxylic acid and most preferably comprises about 9% of the dicarboxylic acid. The second solvent is preferably selected from propylene glycol monobutyl ether, propylene glycol monopropyl ether and diethylene glycol monomethyl ether and is most preferably propylene glycol monobutyl ether. The first organic solvent is preferably selected from the group consisting of isopropanol, n-propanol and benzyl alcohol and is most preferably isopropanol. Preferred amounts of the first organic solvent are in the range of from about 25% to about 75% by weight and preferred amounts of the second organic solvent are from about 10% to about 35% by weight. Preferably, the ratio of the first organic solvent to the second organic solvent is about 3:1. Preferred dicarboxylic acids are adipic acid, pimelic acid, suberic acid, azelaic acid and sebacic acid with pimelic acid being particularly preferred.

The invention also involves the application of the new flux composition to soldering processes used to mount electronic components, such as chips, chip carrier modules, resistors, capacitors, etc., onto PCBs.

Further objectives and advantages will become apparent from a consideration of the description and examples.

DETAILED DESCRIPTION OF THE PREFERRED EMBODIMENTS

In describing preferred embodiments of the present invention, specific terminology is employed for the sake of clarity. However, the invention is not intended to be limited to the specific terminology so selected. All references cited herein are incorporated by reference as if each had been individually incorporated by reference.

The term "a" is intended to mean at least one unless the context indicates otherwise.

The invention is a new flux composition, particularly useful for high density arrays, which leaves essentially no ionic residues at the completion of the soldering process. The flux is used to mount electronic components onto PCBs and is effective with the large number of contact points present in high density arrays. The invention provides optimum chip joint formation.

The invention also involves the application of the new flux composition to soldering processes used to mount electronic components, such as chips, chip carrier modules, resistors, capacitors, etc. onto PCBs.

Significantly, the flux composition includes a dicarboxylic acid ($HOOC(CH_2)_xCOOH$) as the active ingredient, i.e., as the primary fluxing agent. It should be noted that, at room temperature, the preferred dicarboxylic acids, adipic, pimelic, suberic, azelaic and sebacic acids (x=4, 5, 6, 7 and 8, respectively) are solids, having respective melting temperatures of about 152° C., about 105° C., about 144° C., about 107° C. and about 135° C. In addition, the flux composition of the present invention includes two organic solvents, the first of which has a relatively low evaporation temperature, e.g., 82.4° C., and the second of which has a relatively high evaporation temperature, e.g., about 170° C. The flux composition can also include a relatively small amount of water, preferably deionized water. Among dicarboxylic acids, pimelic acid ($HOOC(CH_2)_5COOH$) is preferred. It should be noted that, with pimelic acid, the second organic solvent and the water are soluble in the first organic solvent. Commonly assigned U.S. Pat. Nos. 5,531,838 and 5,615,827 describe a flux composition comprising pimelic acid, a two component solvent and, optionally, water, and a soldering method using that composition. These patents are incorporated herein by reference in their entirety. The composition in these patents, however, allows for the use of only up to about 6% pimelic acid. The specification of those patents states that compositions having more than about 6% pimelic acid leave "undesirably large amounts of residue at the completion of the soldering process."

When used with high density arrays, however, the flux concentration described in the above patents was insufficient. Specifically, use in that concentration range resulted in a significant number of non-wets. Although the lower concentration spread the pimelic acid active ingredient throughout the array, insufficient pimelic acid was in contact with the metal oxide surface to adequately promote wetting, most likely because the large metal oxide surface of high density arrays requires more active ingredient. The higher flux concentration of the present invention is volatilized more readily from the oxidized surface of high density arrays thus minimizing a loss in underfill adhesion. Furthermore, in soldering high density arrays, it was found that the use of dicarboxylic acid concentrations in excess of 6% did not result in undesirably large amounts of residues.

The active fluxing component reacts with surface oxides to form an organometallic when subjected to extended dwell times of 120 to 240 seconds above solder reflow temperature, to enable solder joint information. During the extended dwell time the organometallic is converted to a stable volatile species which is evolved leaving essentially no organic degradation products. This reaction continues with the excess flux vapors to further reduce the occurrence of usual flux residues. Peak temperatures in the range of 210° C. to 245° C., preferably 220° C. to 245° C., may be used for reflow of eutectic tin/lead solder. The flux composition of the present invention may be used with other solder alloys at differing dwell time and peak temperature conditions.

Without being bound by theory it is believed that at elevated temperatures, the pimelic acid forms an organometallic which subsequently tends to cyclize on a solder surface to form (1) a cyclic ketone, cyclohexanone, which is volatile at reflow temperatutes as well as (2) volatile water, and (3) carbon dioxide, instead of forming polymeric residues. The metal oxide is also regenerated in the reactions. Other straight chain dicarboxylic acids of sufficient length, i.e. about 6 or more carbons, share this tendency, particularly the dicarboxylic acids having 6–10 carbon atoms, i.e. adipic, pimelic suberic, azelaic and sebacic acids.

It has been found that it is possible to increase the concentration of the active ingredient in the fluxes of the present invention significantly in the presence of high density arrays without a significant increase in residues. Thus, the present composition utilizes a dicarboxylic acid in a concentration sufficient to react with the oxidized surface area in a high-density array. Ranges of the dicarboxylic acid are typically greater than 6% and fractions up to 100% of the dicarboxylic acid can be applied to the solder areas in principle. Preferably, the composition contains from more than 6% up to about 15% of the dicarboxylic acid. More preferably the dicarboxylic acid is present at about 8% to about 10% of the flux and most preferably at about 9%. Relative amounts of dicarboxylic acid less than 6% by weight are undesirable because they result in insufficient and/or inadequate fluxing action, i.e., insufficient and/or inadequate removal of oxide layers, insufficient reductions in solder surface tensions throughout the solder array leaving a significant number of non-wets. The ability of the dicarboxylic acids to react completely with the metal oxide on the solder surface causing the organometallic compound to form and then subsequently decompose with little or no residue has several advantages. First, no cleaning of residues is required since decomposition products are volatile. Second, the lack of residue allows underfill adhesive to bond strongly to material surfaces forming and surrounding the solder joint. Third, contact non-wets, which can cause latent opens in functional hardware, are avoided. Finally, the excellent solder reflow by the present invention avoids formation of voids and the generation of opens under temperature and moisture stress.

The flux composition of the present invention also typically includes two organic solvents. The first organic solvent is preferably isopropanol (isopropyl alcohol), which has an evaporation temperature of 82.4° C. Useful alternatives to isopropanol include n-propanol and benzyl alcohol. The second organic solvent is preferably propylene glycol monobutyl ether (also denominated N-butylpropylglycol ether), which has an evaporation temperature of about 170° C. Useful alternatives to propylene glycol monobutyl ether include propylene glycol monopropyl ether and diethylene glycol monomethyl ether. It should be noted that upon evaporation of the first organic solvent during the soldering processes described below, the dicarboxylic acid (and the water, if present) is then substantially dissolved in the second organic solvent, until the second organic solvent evaporates during the soldering processes. As noted above, the pimelic acid, the second organic solvent, and the water, if present, are soluble in the first organic solvent. The ratio of the first organic solvent to the second organic solvent is preferably about 3:1.

The relative amount of the first organic solvent, e.g., isopropanol, in the inventive flux composition preferably ranges from about 25% to about 75% by weight and is more preferably about 68% by weight. The relative amount of the second organic solvent, e.g., propylene glycol monobutyl ether, in the inventive flux composition preferably ranges from about 10% to about 35% by weight and is more preferably about 23% by weight.

The relative amount of water, if used, in the inventive fluxes composition ranges from 0% to about 2% by weight. The purpose of the water, if present, is to provide positively charged ions to accelerate the initiation of fluxing action by the pimelic acid. If the inventive flux composition is to be used, for example, in soldering a semiconductor chip to a PCB, then the relative amount of water is preferably about 0.9% by weight. Relative amounts of water greater than about 2% by weight are undesirable because this significantly increases the possibility that the application of the inventive flux composition will result in ionic residues.

By way of example, one embodiment of the inventive flux composition which is useful in soldering a high density C4 array to a PCB is readily formed by dissolving 9.1 grams of pimelic acid, 22.5 grams of propylene glycol monobutyl ether and 0.9 grams of de-ionized water in 67.5 grams of isopropanol.

As noted above, the invention involves not only the flux composition, per se, but also the application of the flux composition to the soldering processes used to mount electronic components onto PCBs. Thus, for example, in mounting a semiconductor chip, such as in the socal led flip-hip configuration, onto a PCB, contact pads on the circuitry-bearing surface of the chip are provided with solder regions, e.g., solder balls. These solder regions have compositions which include, for example, 97 atomic percent lead (Pb) and 3 atomic percent tin (Sn). Significantly, such solder regions have relatively high melting temperatures and do not melt during the soldering process described below.

Prior to soldering the chip to the PCB, contact pads on the circuitry-bearing surface of the PCB are provided with relatively small solder regions, e.g., relatively small solder balls. These relatively small solder regions are readily transported to, and deposited on, the contact pads via a decal. By contrast with the solder regions used with the chip, the solder regions have compositions which include, for example, 37 atomic percent Pb and 63 atomic percent Sn. These solder regions have melting temperatures of about 183° C. and do melt during the soldering process, described below.

Prior to soldering the chip to the PCB, the inventive flux composition is applied to the solder regions, and/or the solder regions, and/or the contact pads on the PCB, and/or the contact pads on the chip. This is readily accomplished using, for example, a syringe or a brush.

Having applied the inventive flux composition to the relevant solder regions and/or contact pads, the chip is positioned relative to the PCB so that the solder regions contact the solder regions. Consequently, these combined solder regions substantially extend from the chip contact pads to the PCB contact pads.

With the solder regions of the chip and the PCB touching each other, the chip PCB assembly is heated in, for example, an oven. During this heating procedure, the oven temperature is initially raised to about 183° C., and subsequently raised to a temperature of from about 210° C. to about 245° C., preferably about 220° C. to 245° C. The oven temperature is then lowered to about 183° C., and finally lowered to room temperature. The dwell time, i.e. the time the temperature is maintained above the reflow temperature, is about 120–240 seconds compared with typical dwell times of 60–180 seconds used in soldering low density array with conventional fluxes. As a consequence, the solder regions undergo melting and flow around the solder regions, resulting in continuous metallurgical and electrical connections between the PCB and the chip. While the cleaning of these continuous connections would be extremely difficult, and perhaps even impossible, no such cleaning is needed because essentially no ionic residues remain at the completion of this soldering process.

At the completion of the above-described soldering process, the continuous solder connections between the PCB and the chip are preferably encapsulated in, for example, an epoxy resin, using conventional techniques.

If the electronic component to be mounted onto a PCB is, for example, a (pinless) chip carrier module bearing at least one semiconductor chip, then such a module is readily mounted by, for example, screening solder regions onto contact pads on the non-chip-bearing surface of the module. Such solder regions may also be screened onto corresponding contact pads on the PCB. The inventive flux composition is then applied to the solder regions and/or the module contact pads and/or the PCB contact pads using, for example, a syringe or a brush. Thereafter, the module is positioned in relation to the PCB so that the solder regions on the module contact pads touch the solder regions on the PCB contact pads. Thus, these combined solder regions substantially extend from the module contact pads to the PCB contact pads. Then, with the module solder regions touching the PCB solder regions, the module/PCB assembly is heated in, for example, an oven in order to melt the module solder regions and/or the PCB solder regions. By contrast with the above, if the electronic component to be mounted onto a PCB is, for example, a pinned chip carrier module bearing at least one semiconductor chip, then such a module is readily mounted by initially applying the inventive flux composition to the module pins and/or to the walls of corresponding PTHs in the PCB. This is readily accomplished (using any of a variety of conventional techniques) before the module pins are inserted into the PTHs, while the module pins are being inserted into the PTHs, or after the module pins are inserted into the PTHs. Preferably, this is accomplished after the module pins have been inserted into the PTHs by, for example, placing the module/PCB assembly on a conveyor, which passes this assembly over a fluxing wave or a flux sprayer. This fluxing wave or flux sprayer serves to impinge the inventive flux composition onto the bottom surface of the PCB and into the PTHs. The impinged flux is wicked up into the PTHs, and thus the inventive flux composition is applied to both the walls of the PTHs and to the module pins. Thereafter, the conveyor preferably serves to pass the module/PCB assembly over a solder wave, which serves to impinge liquid solder onto the bottom surface of the PCB and into the PTHs. This liquid solder is also wicked up into the PTHs, filling the PTHs and, upon cooling and solidification, serving to encapsulate the pins within the PTHs.

If the electronic component to be mounted onto a PCB is, for example, a discrete, passive electronic component, such as an electrical resistor or capacitor, having leads instead of pins, then such an electronic component is readily mounted using a procedure which is almost the same as that used with a pinned chip carrier module. The only difference is that the leads of the discrete, passive electronic component are not positioned inside the PTHs. Rather, these leads are positioned adjacent the PTHS, e.g., these leads are placed in contact with the lands encircling the PTHs. Thus, when the component/PCB assembly is passed over the fluxing wave or flux sprayer, the inventive flux composition is wicked up into the PTHS, onto the lands and onto the bottom portions of the leads. Similarly, when the component/PCB assembly is passed over the solder wave, liquid solder is wicked up into the PTHs, onto the lands encircling the PTHs and onto the bottom portions of the leads.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, and elements added or omitted, without departing from the invention, as appreciated by those skilled in the art in light of the above teachings. It is therefore to be understood that, within the scope of the claims and their equivalents, the invention may be practiced otherwise than as specifically described.

What is claimed is:

1. A single phase flux composition suitable for use with high density arrays, comprising:
   (a) at least one dicarboxylic acid in an amount sufficient to react with the oxidized surface area in a high density array,
   (b) a first organic solvent, and
   (c) a second organic solvent having a higher evaporation temperature than that of said first organic solvent.

2. The composition of claim 1, wherein the composition comprises greater than 6% dicarboxylic acid.

3. The composition of claim 2, wherein the composition comprises greater than 6% to about 15% of dicarboxylic acid.

4. The composition of claim 3, wherein the composition comprises about 8% to about 10% of dicarboxylic acid.

5. The composition of claim 4, wherein the composition comprises about 9% of dicarboxylic acid.

6. The composition of claim 1, wherein the composition comprises from about 25% to about 75% by weight of the first organic solvent and from about 10% to about 35% by weight of the second organic solvent.

7. The composition of claim 1, wherein the ratio of the first organic solvent to the second organic solvent is about 3:1.

8. The composition of claim 1, further comprising up to about 2% by weight of water.

9. The composition of claim 1, wherein said second solvent is selected from the group consisting of propylene glycol monobutyl ether, propylene glycol monopropyl ether and diethylene glycol monomethyl ether.

10. The composition of claim 1, wherein said first organic solvent is selected from the group consisting of isopropanol, n-propanol and benzyl alcohol.

11. The composition of claim 1, wherein the at least one dicarboxylic acid is selected from the group consisting of adipic acid, pimelic acid, suberic acid, azelaic acid, sebacic acid and combinations thereof.

12. The composition of claim 11, wherein the dicarboxylic acid is pimelic acid.

13. A method for mounting an electronic component onto a printed circuit board, which electronic component includes a surface bearing component contact pads and which printed circuit board includes a surface bearing board contact pads corresponding to said component contact pads, said component contact pads and/or said board contact pads bearing regions of solder, comprising the steps of:

applying a flux composition to said solder regions and/or said component contact pads and/or said board contact pads, said flux composition comprising:
(a) at least one dicarboxylic acid in an amount sufficient to react with the oxidized surface area in a high-density array,
(b) a first organic solvent,
(c) a second organic solvent having a higher evaporation temperature than said first organic solvent.

14. The method of claim 13, wherein the flux composition comprises greater than 6% dicarboxylic acid.

15. The method of claim 13, wherein the composition comprises about 6% to about 15% of dicarboxylic acid.

16. The method of claim 13, wherein the composition comprises about 8% to about 10% of dicarboxylic acid.

17. The method of claim 13, wherein the composition comprises about 9% of dicarboxylic acid.

18. The method of claim 13, wherein the flux composition further comprises up to 2% by weight of water; and positioning said electronic component in relation to said printed circuit board so that said regions of solder substantially extend from said component contact pads to said board contact pads; and applying heat, so that at least portions of at least some of said solder regions melt and flow.

19. The method of claim 13, wherein the at least one dicarboxylic acid is selected from the group consisting of adipic acid, pimelic acid, suberic acid, azelaic acid, sebacic acid and combinations thereof.

20. The method of claim 13, wherein the dicarboxylic acid is pimelic acid.

21. The method of claim 13, wherein said second solvent is selected from the group consisting of propylene glycol monobutyl ether, propylene glycol monopropyl ether and diethylene glycol monomethyl ether.

22. The method of claim 13, wherein said first organic solvent is selected from the group consisting of isopropanol, n-propanol and benzyl alcohol.

23. The method of claim 13, wherein the composition comprises from about 25% to about 75% by weight of the first organic solvent and from about 10% to about 35% by weight of the second organic solvent.

24. The method of claim 13, wherein the ratio of the first organic solvent to the second organic solvent is about 3:1.

25. The method of claim 13, wherein the electronic component is a high density array.

26. The method of claim 13, further comprising heating the component and printed circuit board to a temperature of about 220° C. to about 245° C.

27. The method of claim 13, wherein the component and the printed circuit board are heated with a dwell time of 120 to 240 seconds.

28. A method for mounting an electronic component onto a printed circuit board, which electronic component includes electrically conductive members extending from said component and which printed circuit board includes plated through holes extending from a first surface to a second surface of said printed circuit board, comprising the steps of:

applying a flux composition to said electrically conductive members and/or said plated through holes, said flux composition comprising:
(a) greater than 6% to about 15% by weight pimelic acid,
(b) 25 to 75% by weight of a first organic solvent,
(c) 10 to 35% by weight of a second organic solvent having a higher evaporation temperature than said first organic solvent, prior to, during or after said applying step, positioning said electronic component adjacent to said first surface of said printed circuit board so that said electrically conductive members extend into, or are positioned adjacent to, said plated through holes; and impinging liquid solder onto said second surface of said printed circuit board and into said plated through holes, whereby said liquid solder flows through said plated through holes from said second surface toward said first surface to contact said electrically conductive members.

29. The method of claim 28, wherein the flux composition comprises about 9% pimelic acid.

30. A no clean flux composition comprising about 9% of a dicarboxylic acid, about 68% of a first organic solvent and about 23% of a second organic solvent wherein the second organic solvent has a higher evaporation temperature than the first organic solvent.

31. The composition of claim 30, wherein the dicarboxylic acid is pimelic acid, the first organic solvent is isopropanol and the second organic solvent is propylene glycol monobutyl ether.

32. The composition of claim 30, further comprising about 0.9% of water.

* * * * *